(12) United States Patent
Darabi et al.

(10) Patent No.: US 7,071,790 B2
(45) Date of Patent: Jul. 4, 2006

(54) METHOD AND SYSTEM FOR A DIFFERENTIAL SWITCHED CAPACITOR ARRAY FOR A VOLTAGE CONTROLLED OSCILLATOR (VCO) OR A LOCAL OSCILLATOR (LO) BUFFER

(75) Inventors: Hooman Darabi, Irvine, CA (US); John Leete, Huntington Beach, CA (US)

(73) Assignee: Broadcom Corporation, Irvine, CA (US)

( * ) Notice: Subject to any disclaimer, the term of this patent is extended or adjusted under 35 U.S.C. 154(b) by 49 days.

(21) Appl. No.: 10/977,771

(22) Filed: Oct. 29, 2004

(65) Prior Publication Data

US 2006/0091968 A1    May 4, 2006

(51) Int. Cl.
*H03L 1/00*       (2006.01)
*H03B 5/12*       (2006.01)

(52) U.S. Cl. ............ 331/175; 331/117 R; 331/117 FE; 331/177 R; 331/179

(58) Field of Classification Search ................ 331/115, 331/117 R, 117 FE, 117 D, 132, 175, 177 R, 331/179
See application file for complete search history.

(56) References Cited

U.S. PATENT DOCUMENTS

| | | | | |
|---|---|---|---|---|
| 6,013,958 A * | 1/2000 | Aytur | .......................... | 307/109 |
| 6,239,665 B1 * | 5/2001 | Strom | .................. | 331/117 FE |
| 6,621,365 B1 * | 9/2003 | Hallivuori et al. | .......... | 331/179 |
| 6,624,484 B1 * | 9/2003 | Christensen | ................ | 257/390 |
| 6,661,301 B1 * | 12/2003 | Traub | ..................... | 331/117 R |
| 6,815,996 B1 * | 11/2004 | Hsiao | ......................... | 327/337 |
| 6,940,358 B1 * | 9/2005 | Meacham | ............... | 331/117 R |
| 6,992,532 B1 * | 1/2006 | Christensen | .......... | 331/117 FE |
| 2002/0070815 A1 * | 6/2002 | Traub | ..................... | 331/117 R |
| 2005/0174184 A1 * | 8/2005 | Wu | ............................. | 331/176 |

* cited by examiner

*Primary Examiner*—David Mis
(74) *Attorney, Agent, or Firm*—McAndrews, Held & Malloy, Ltd.

(57) ABSTRACT

Methods and systems for increasing an amplifier circuit's Q factor are disclosed herein. The method may comprise coupling a first LC tank to a source of a single switching transistor and coupling a second LC tank to a drain of the single switching transistor. A gate of the single switching transistor may be controlled by an amplifier core coupled to the first LC tank and the second LC tank. A resistance of the first LC tank and the second LC tank may be decreased by about one half, which increases the Q factor by about two. The gate of the single switching transistor may be controlled by a control signal generator coupled to the amplifier core. The first LC tank and/or the second LC tank may be tuned to a frequency of about 3.4 GHz to 4 GHz. The single switching transistor may comprise an NMOS transistor.

26 Claims, 5 Drawing Sheets

500

METHOD AND SYSTEM FOR A DIFFERENTIAL SWITCHED CAPACITOR ARRAY FOR A VOLTAGE CONTROLLED OSCILLATOR (VCO) OR A LOCAL OSCILLATOR (LO) BUFFER

RELATED APPLICATIONS

This application is related to the following applications, each of which is incorporated herein by reference in its entirety for all purposes:

U.S. patent application Ser. No. 10/976,976 filed Oct. 29, 2004;
U.S. patent application Ser. No. 10/976,977 filed Oct. 29, 2004;
U.S. patent application Ser. No. 10/977,000 filed Oct. 29, 2004;
U.S. patent application Ser. No. 10/976,575 filed Oct. 29, 2004;
U.S. patent application Ser. No. 10/977,464 filed Oct. 29, 2004;
U.S. patent application Ser. No. 10/977,798 filed Oct. 29, 2004;
U.S. patent application Ser. No. 10/977,005 filed Oct. 29, 2004;
U.S. patent application Ser. No. 10/977,868 filed Oct. 29, 2004;
U.S. patent application Ser. No. 10/976,666 filed Oct. 29, 2004;
U.S. patent application Ser. No. 10/977,631 filed Oct. 29, 2004;
U.S. patent application Ser. No. 10/976,639 filed Oct. 29, 2004;
U.S. patent application Ser. No. 10/977,210 filed Oct. 29, 2004;
U.S. patent application Ser. No. 10/977,872 filed Oct. 29, 2004;
U.S. patent application Ser. No. 10/977,869 filed Oct. 29, 2004;
U.S. patent application Ser. No. 10/977,874 filed Oct. 29, 2004;
U.S. patent application Ser. No. 10/976,996 filed Oct. 29, 2004.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to the processing of radio signals in a receiver and/or transceiver. More specifically, certain embodiments of the invention relate to a method and system for a differential switched capacitor array for a voltage controlled oscillator (VCO) or a local oscillator (LO) buffer.

BACKGROUND OF THE INVENTION

Modern communication devices, such as radio frequency (RF) communication devices, process electromagnetic wave signals with variable signal strength. The signal strength varies depending on distance between a transmitter and a receiver, as well as environmental factors and process, temperature etc. variations (PVT). A power amplifier (PA) is utilized prior to signal transmission by a transmitter, for example, and a variable gain low noise amplifier (LNA) is utilized after a signal is received by a receiver, to amplify the signal and adjust the signal gain accordingly.

Conventional amplifying devices, such as LNAs, PAs, and/or buffers, as well as voltage controlled oscillators (VCOs) and other differential input/output circuits, utilize one or more circuits with switched capacitor tuning. One or more switched capacitors may utilize separate switches that turn ON and/or OFF individual capacitors to achieve circuit and signal tuning. Conventional switched capacitors, however, are characterized by an inherent resistance factor generated by each switch. Such inherent resistance is directly proportional to the quality factor of the circuit and/or device utilizing the switched capacitor tuning. As a result, the device quality factor, as well as the device efficiency, deteriorate With the use of switched capacitor tuning.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

Certain embodiments of the invention may be found in a method and system for increasing a Q factor of an amplifier circuit. The method may comprise coupling a first LC tank to a source of a single switching transistor and coupling a second LC tank to a drain of the single switching transistor. A gate of the single switching transistor may be controlled by an amplifier core coupled to the first LC tank and the second LC tank. The amplifier core coupled to the first LC tank and the second LC tank may control a gate of the single switching transistor to decrease resistance by about one half, which increases the Q factor by about two. The gate of the single switching transistor may be controlled by a control signal generator coupled to the amplifier core. The first LC tank and/or the second LC tank may be tuned to a frequency of about 3.4 GHz to 4 GHz.

The single switching transistor may comprise an NMOS transistor. A first plurality of LC tanks may be coupled to the first LC tank. The first plurality of LC tanks may comprise LC tanks connected in parallel and/or a binary weighted array of switchable capacitors. A second plurality of LC tanks may be coupled to the second LC tank. The second plurality of LC tanks may comprise LC tanks connected in parallel and/or a binary weighted array of switchable capacitors. The source of the single switching transistor may be coupled to a second switching transistor and the drain of the single switching transistor may be coupled to a third switching transistor.

The system may comprise a first LC tank that is coupled to a source of a single switching transistor and a second LC tank that is coupled to a drain of the single switching transistor. An amplifier core may be coupled to the first LC tank and the second LC tank. The amplifier core may control a gate of the single switching transistor decrease a resistance of the first LC tank and the second LC tank by about one half, thus increasing the Q factor by about two. A control signal generator may be coupled to the amplifier core, and the control signal generator may be adapted to control the gate of the single switching transistor. The amplifier core may tune the first LC tank and/or the second LC tank to a frequency of about 3.4 GHz to 4 GHz.

The single switching transistor may comprise an NMOS transistor. A first plurality of LC tanks may be coupled to the first LC tank, where the first plurality of LC tanks may comprise LC tanks connected in parallel and/or as a binary weighted array of switchable capacitors. A second plurality of LC tanks may be coupled to the second LC tank, where the second plurality of LC tanks may comprise LC tanks connected in parallel and/or as a binary weighted array of switchable capacitors. A second switching transistor may be coupled to the source of the single switching transistor and a third switching transistor may be coupled to the drain of the single switching transistor.

These and other features and advantages of the present invention may be appreciated from a review of the following detailed description of the present invention, along with the accompanying figures in which like reference numerals refer to like parts throughout.

DETAILED DESCRIPTION OF THE INVENTION

Certain aspects of the invention may be found in a method and system for increasing an amplifier circuit's Q factor. An amplifying device, such as a low noise amplifier (LNA), a power amplifier (PA), and/or a buffer, as well as an oscillator, such as a voltage controlled oscillator (VCO), may utilize one or more signal tuning circuits comprising one or more switched capacitors. For example, a VCO and/or an amplifying device may utilize an inductance-capacitance (LC) tank for tuning one or more signals, where a switch, such as an NMOS transistor, may be utilized to selectively turn ON and/or OFF the tuning LC tank.

In an exemplary embodiment of the invention, a VCO may be utilized within a radio frequency (RF) transceiver and one or more LC tanks may be utilized within the VCO to tune a differential output of the VCO. The VCO, and the corresponding differential output LC-tanks, may be adapted for tuning over a broad range of frequencies, such as from about 3.4 GHz to about 4 GHz, for example. Resistance associated with each switch within the switched capacitor LC-tuning tanks may be reduced by connecting corresponding differential switched capacitors in series, separated by a single switching transistor, rather than two separate transistors for each differential LC-tank. In this manner, by reducing the number of switching transistors and the corresponding resistance associated with the switch, the quality factor of the circuit, Q, may be proportionately increased.

Figure 1:
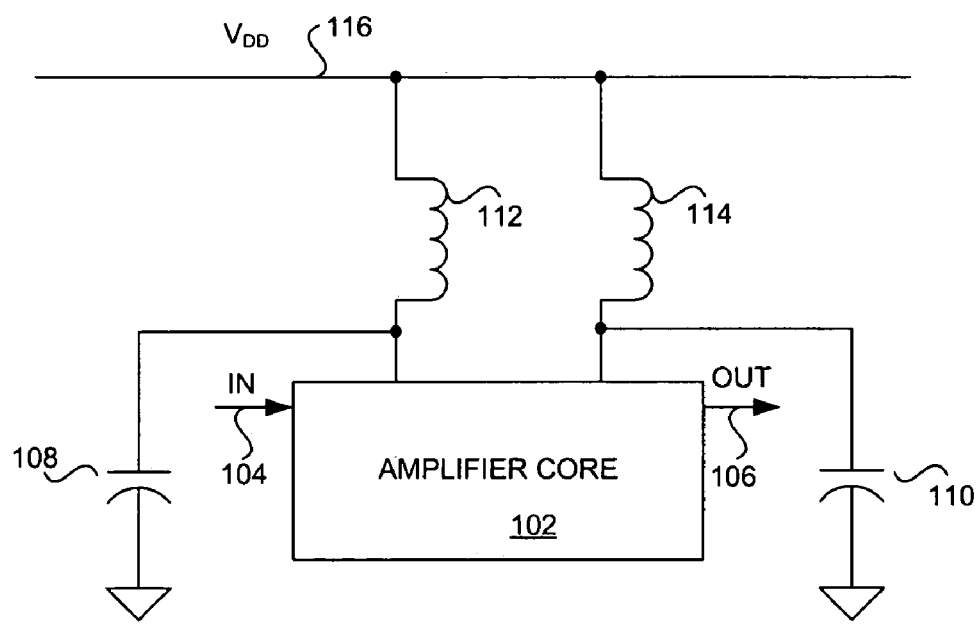
FIG. 1 is a circuit illustrating an amplifier circuit that may be utilized in connection with an embodiment of the invention.

FIG. 1 is a circuit illustrating an amplifier circuit 100 that may be utilized in connection with an embodiment of the invention. Referring to FIG. 1, the amplifier circuit 100 may comprise an amplifier core 102, inductors 112 and 114, capacitors 108 and 110, and a voltage supply rail 116. In operation, the LC-tank comprising inductor 112 and capacitor 108 and/or the LC-tank comprising inductor 114 and capacitor 110 may be tuned to a resonance frequency $f_0$. For example, the LC-tank comprising inductor 112 and capacitor 108 and/or the LC-tank comprising inductor 114 and capacitor 110 may be tuned to a frequency range of about 3.4 GHz to about 4 GHz. The amplifier core 102 may comprise suitable circuitry or logic and may be adapted to amplify an incoming differential signal and generate an output differential signal.

The amplifier circuit 100 may be utilized for signal amplification immediately after a signal is received by a receiver, for example. In addition, the amplifier circuit 100 may also be utilized to amplify a signal prior to transmission. Depending on the particular application, the amplifier core 102 may be utilized with additional circuitry, such as a mixer, to downconvert or upconvert a signal, if the amplifier circuit 100 is used in a receiver LNA or a transmitter PA, respectively.

In one aspect of the invention, the amplifier circuit 100 may be implemented in buffers and/or VCOs that utilize switched capacitor tuning. In this manner, the differential output LC-tank comprising inductor 112 and capacitor 108 and/or the LC-tank comprising inductor 114 and capacitor 110 may be adapted to utilize one or more switches that turn capacitor 108 and/or capacitor 110 ON or OFF. The capacitor switches may comprise one or more NMOS transistors, for example. The amplifying circuit 100, and the corresponding differential output LC-tank comprising inductor 112 and capacitor 108 and/or the LC-tank comprising inductor 114 and capacitor 110, may be adapted for tuning over a broad range of frequencies, such as from about 3.4 GHz to about 4 GHz, for example.

The tuning frequency $f_0$ of each differential output LC-tank may be determined from the following equation:

$$f_0 = \frac{1}{2\Pi\sqrt{LC}}$$

Since the tuning frequency $f_0$ depends on the capacitance of the LC-tank, one or more LC-tanks may be utilized in parallel for each differential output of the amplifying circuit 100. In addition, each LC-tank may utilize switched capacitors for improved tuning capabilities of the amplifying circuit 100.

Figure 2:
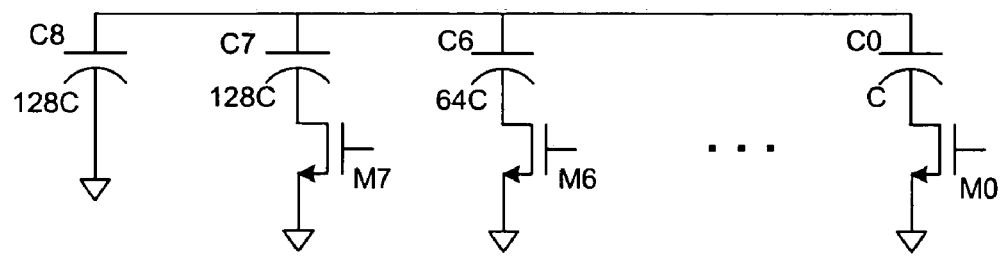
FIG. 2 is a circuit illustrating a binary weighted capacitor array that may be utilized in connection with an embodiment of the invention.

FIG. 2 is a circuit illustrating a binary weighted capacitor array 200 that may be utilized in connection with an embodiment of the invention. Referring to FIG. 2, the binary weighted capacitor array 200 may be implemented in an electric signal processing device, such as a VCO and/or a local oscillator (LO) buffer, for example, that may utilize differential switched capacitor tuning over a broad range of frequencies. For example, a VCO may utilize the binary weighted capacitor array 200 in a GSM radio during generation of a differential oscillator signal at frequency range of about 3.4 GHz to about 4 GHz.

The binary weighted capacitor array 200 may comprise a 7-bit switched capacitor array and may be a part of one or more LC-tanks within a VCO, for example. In this regard, the binary weighted capacitor array 200 may comprise switched capacitors C0 through C7 with corresponding transistors M0 through M7. Each of the legs in the 7-bit switched capacitor array may comprise a switched capacitor and a switching transistor and each leg is coupled in parallel. The last leg, however, does not comprise a switching transistor but only comprises a capacitor.

In one aspect of the invention, each of the switched capacitors Cn within the 7-bit binary weighted capacitor array 200 may be selected with capacitance that is a $2^n$ multiple of a capacitance unit "C." Single capacitor C8 may be selected with capacitance at (128*C), for example. Capacitor C0 may be selected with capacitance ($2^0$*C), which equals C. Similarly, capacitor M6 may be selected with capacitance ($2^6$*C), which equals (64*C). The seventh capacitor C7 may then be selected with capacitance (128*C). In this manner, the total capacitance of capacitors C0 through C7 may equal (255*C), which is approximately twice as large as the capacitance C8.

Switching transistors M0 through M7 may comprise NMOS transistors, for example, and may be adapted to selectively switch each corresponding capacitor ON or OFF. By utilizing switched capacitor tuning, the binary weighted capacitor array 200 may be adapted to selectively change the total capacitance of the LC-tank and achieve a broad tuning frequency range. However, since each switching transistor may be characterized by an inherent resistance factor, the quality factor Q of the LC-tank and the VCO may be decreased with the number of switches utilized in the binary weighted capacitor array 200.

The quality factor Q of the LC-tank with a switching transistor may be determined from the following equation:

$$Q = \frac{1}{C(2\Pi f_0)R},$$

where C is the capacitance of the LC-tank and R is the switching transistor equivalent ON resistance. Since the quality factor Q of the circuit is inversely proportional to the equivalent ON resistance R of the switching transistor, the quality factor Q of the LC-tank and the VCO may be decreased with the number of switches utilized in the binary weighted capacitor array 200.

In one aspect of the invention, the quality factor Q of the LC-tank and the VCO may be improved by a factor of about two by connecting each differential pair of corresponding switched capacitors in series, separated by a single switching transistor, instead of two separate switches for each differential switched capacitor. By utilizing a single switching transistor, the resulting resistance within the differential LC-tank may be reduced by a factor of about two, thereby increasing the quality factor Q of the circuit by a factor of about two.

Figure 3:
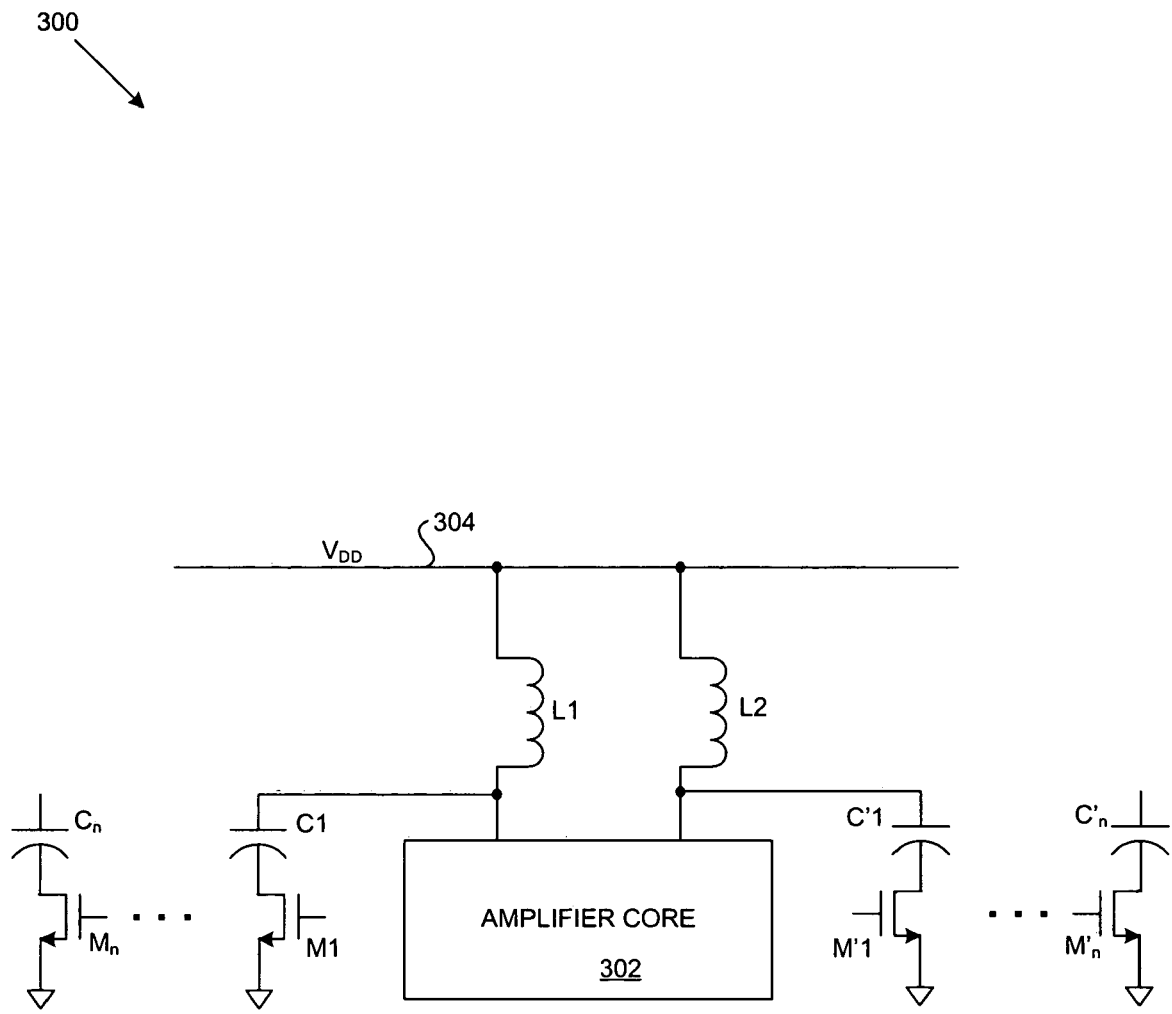
FIG. 3 is a circuit illustrating an amplifier circuit with LC tuning tanks and switchable transistors that may be utilized in connection with an embodiment of the invention.

FIG. 3 is a circuit illustrating an amplifier circuit 300 with LC tuning tanks and switchable transistors that may be utilized in connection with an embodiment of the invention. Referring to FIG. 3, the amplifier circuit 300 may comprise an amplifier core 302, a voltage supply rail 304 for supply voltage $V_{DD}$, inductors L1 and L2, capacitors C1 through $C_n$ corresponding to inductor L1, and capacitors C'1 through $C'_n$, corresponding to inductor L2. Inductor L1 and capacitors C1 through $C_n$ may form a first LC-tank and inductor L2 and capacitors C'1 through $C'_n$ may form a second LC-tank. The first and second LC-tank within the amplifying circuit 300 may be adapted to tune the amplifying circuit and generate a differential output signal that may cover a broad frequency range.

In operation, the first or second LC-tank may be tuned to a resonance frequency $f_0$. For example, the first and second LC-tank within the amplifying circuit 300 may be tuned to resonate at about 3.4 GHz to about 4 GHz, for an incoming differential signal, such as a multiband signal. The amplifier core 302 may comprise suitable circuitry or logic and may be adapted to amplify the incoming differential signal to generate an output differential signal.

In one aspect of the invention, the amplifier circuit 300 may be implemented in a local oscillator (LO) buffer and/or a voltage controlled oscillator (VCO), for example, that utilize differential switched capacitor tuning. In this manner, the first and second differential output LC-tanks comprising inductors L1 and L2 and capacitors C1 through $C_n$ and C'1 through $C'_n$ may be adapted to utilize one or more switches that turn capacitors C1 through $C_n$ and C'1 through $C'_n$ ON or OFF. Accordingly, each of the capacitors C1 through $C_n$ and C'1 through $C'_n$ may utilize switching transistors M1 through $M_n$ and M'1 through $M'_n$, respectively. The capacitor switches M1 through $M_n$ and M'1 through $M'_n$ may comprise one or more NMOS transistors, for example.

In another aspect of the invention, the quality factor Q of the first and second LC-tank within the amplifying circuit 300 may be improved by a factor of about two by connecting each differential pair of corresponding switched capacitors in series, separated by a single switching transistor, instead of two separate switches for each differential switched capacitor. By utilizing a single switching transistor, the resulting resistance within the differential LC-tank may be reduced by a factor of about two, thereby increasing the quality factor Q of the circuit by a factor of about two. For example, capacitor C1 may be connected in series with corresponding capacitor C'1, separated by only one switching transistor. Additional differential switched capacitor pairs may also be coupled in this manner, thereby resulting in an increase in the quality factor Q of the amplifying circuit 300.

Figure 4:
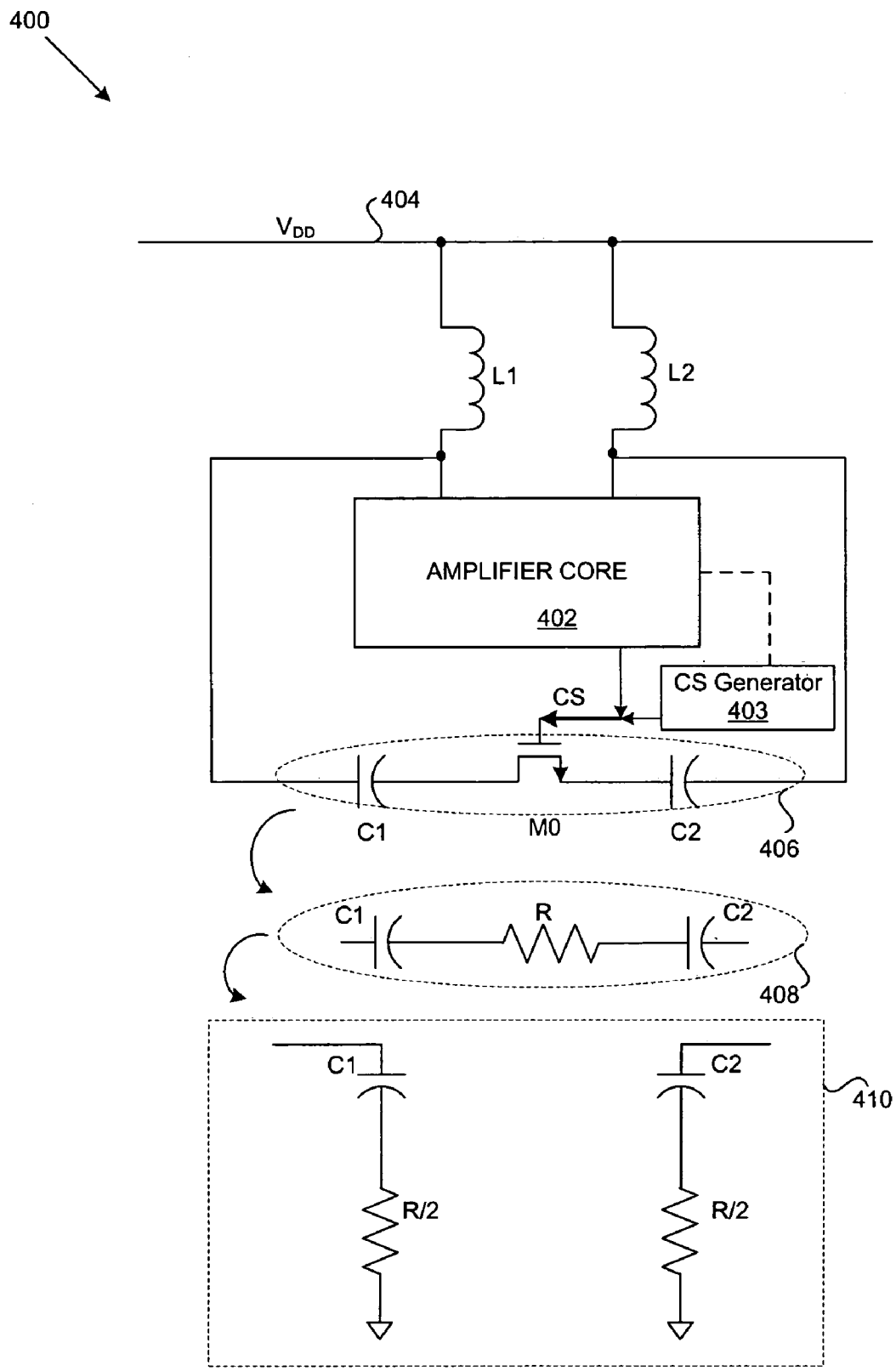
FIG. 4 is a circuit illustrating an amplifier circuit with differential switched capacitor array, in accordance with an embodiment of the invention.

FIG. 4 is a circuit illustrating an amplifier circuit 400 with a differential switched capacitor array, in accordance with an embodiment of the invention. Referring to FIG. 4, the amplifier circuit 400 may comprise an amplifier core 402, a voltage supply rail 404 for supply voltage $V_{DD}$, inductors L1 and L2, capacitors C1 and C2, switching transistor M0 and a control signal (CS) generator 403. Inductor L1 and capacitor C1 may form a first LC-tank and inductor L2 and capacitor C2 may form a second LC-tank. The first and second LC-tank within the amplifying circuit 400 may be adapted to tune the amplifying circuit and generate a differential output signal that may cover a broad frequency range.

In operation, the first or second LC-tank may be tuned to a resonance frequency $f_0$. For example, the first and second LC-tank within the amplifying circuit 400 may be tuned to resonate at about 3.4 GHz to about 4 GHz, for an incoming differential signal, such as a multiband signal. The amplifier core 302 may comprise suitable circuitry or logic and may be adapted to amplify the incoming differential signal to generate an output differential signal.

In another aspect of the invention, the quality factor Q of the first and second LC-tank within the amplifying circuit 400 may be improved by a factor of about two by connecting the differential pair of corresponding switched capacitors C1 and C2 in series, separated by the single switching transistor M0. The first and second LC tank parameters, such as capacitance, inductance, switching transistor size, and switch equivalent ON resistance may stay the same as prior to connecting the two capacitors C1 and C2 in series. However, only one of the two switching transistors may be utilized resulting in a decrease in the switch effective ON resistance by about two. Since the quality factor Q is inversely proportionate to the switch equivalent ON resistance R, reducing R by about two may result in increasing the quality factor Q by about two.

A source of the NMOS switching transistor M0 may be coupled to capacitor C2 and a drain of the switching transistor M0 may be coupled to capacitor C1. The gate of switching transistor M0 may be adapted to receive a control signal (CS). The control signal may be generated by the amplifier core 402 and/or by the CS generator 403. If a control signal is generated by the amplifier core 402 and/or the CS generator 403 and communicated to the switch M0, the switch M0 may turn differential switched capacitors C1 and C2 ON. If the amplifier core 402 and/or the CS generator 403 stop generation of the control signal, the switch M0 may be turned OFF, which may result in the capacitors C1 and C2 being turned OFF, or resulting in the capacitors C1 and C2 be represented as floating capacitors.

Referring again to FIG. 4, there is also illustrated equivalency circuits for instances when the switching transistor M0 is turned ON. The inherent resistance of the switching transistor M0 may be represented as R. By utilizing the single switching transistor M0, the resulting resistance R within the differential LC-tank may be reduced by a factor of about two, thereby increasing the quality factor Q of the circuit by a factor of about two. This may be represented as individual resistors with resistance R/2 being coupled to each of the differential switched capacitors C1 and C2.

Figure 5:
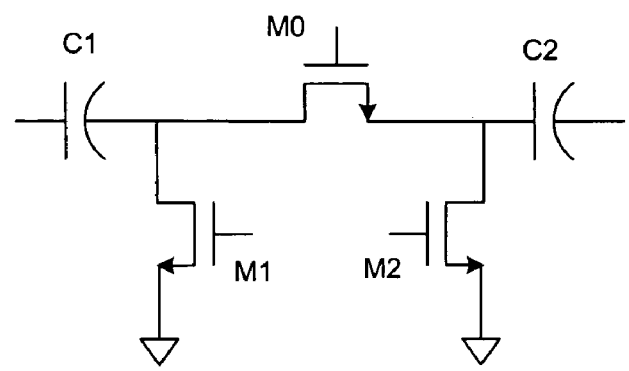
FIG. 5 is a circuit illustrating a differential switched capacitor array with DC biasing transistors that may be utilized in connection with an embodiment of the invention.

FIG. 5 is a circuit illustrating a differential switched capacitor array 500 with DC biasing transistors that may be utilized in connection with an embodiment of the invention. Referring to FIG. 5, the differential switched capacitor array 500 may be the differential switched capacitor array C1-M0-C2 illustrated on FIG. 4. In one aspect of the invention, the differential switched capacitor array 500 may also utilize switching transistors M1 and M2. Switching transistors M1 and M2 may comprise NMOS transistors and may be utilized within the differential switched capacitor array 500 to establish a DC path, or a 0V voltage between the capacitors C1 and C2 when the switching transistor M0 is OFF and capacitors C1 and C2 may be represented as floating capacitors.

Even though the present invention may be implemented with regard to switched capacitor tuning in an amplifying device, such as an LNA, a PA, and/or a buffer, a local oscillator buffer or within a VCO, the invention may not be so limited. A differential switched capacitor array with capacitors connected in series and separated by a switch may be implemented in any electronic signal processing device that may utilize differential switched capacitor tuning.

Accordingly, aspects of the invention may be realized in hardware, software, firmware or a combination thereof. The invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for increasing an amplifier's performance, the method comprising:
   coupling a first LC tank directly to a source of only a single switching transistor;
   coupling a second LC tank directly to a drain of only said single switching transistor; and
   controlling a gate of only said single switching transistor by an amplifier core coupled to said first LC tank and said second LC tank so as to cause a resistance of said first LC tank and said second LC tank to decrease by about one half, thereby increasing a Q factor of the amplifier by about two via said controlling of only said single switching transistor.

2. The method according to claim 1, further comprising controlling said gate of said single switching transistor by a control signal generator coupled to said amplifier core.

3. The method according to claim 1, further comprising tuning at least one of said first LC tank and second LC tank to a frequency of about 3.4 GHz to 4 GHz.

4. The method according to claim 1, wherein said single switching transistor comprises an NMOS transistor.

5. The method according to claim 1, further comprising coupling a first plurality of LC tanks to said first LC tank.

6. The method according to claim 5, wherein said first plurality of LC tanks comprises LC tanks connected in parallel.

7. The method according to claim 5, wherein said first plurality of LC tanks comprises a binary weighted array of switchable capacitors.

8. The method according to claim 1, further comprising coupling a second plurality of LC tanks to said second LC tank.

9. The method according to claim 8, wherein said second plurality of LC tanks comprises LC tanks connected in parallel.

10. The method according to claim 8, wherein said second plurality of LC tanks comprises a binary weighted army of switchable capacitors.

11. The method according to claim 1, further comprising coupling said source of said single switching transistor to a second switching transistor.

12. The method according to claim 1, further comprising coupling said drain of said single switching transistor to a third switching transistor.

13. A system for increasing an amplifier's performance, the system comprising:
   a first LC tank that is directly coupled to a source of only a single switching transistor;
   a second LC tank that is directly coupled to a drain of only single switching transistor; and
   an amplifier core coupled to said first LC tank, said second LC tank, and directly to a gate of only said switching transistor so as to cause a resistance of said first LC tank and said second LC tank to decrease by about one half, thereby increasing a Q factor of the amplifier by about two.

14. The system according to claim 13, further comprising a control signal generator coupled to said amplifier core, wherein said control signal generator controls said gate of said single switching transistor.

15. The system according to claim 13, wherein said amplifier core tunes at least one of said first LC tank and second LC tank to a frequency of about 3.4 GHz to 4 GHz.

16. The system according to claim 13, wherein said single switching transistor comprises an NMOS transistor.

17. The system according to claim 13, further comprising a first plurality of LC tanks coupled to said first LC tank.

18. The system according to claim 17, wherein said first plurality of LC tanks comprises LC tanks connected in parallel.

19. The system according to claim 17, wherein said first plurality of LC tanks comprises a binary weighted array of switchable capacitors.

20. The system according to claim 13, further comprising a second plurality of LC tanks coupled to said second LC tank.

21. The system according to claim 20, wherein said second plurality of LC tanks comprises LC tanks connected in parallel.

22. The system according to claim 20, wherein said second plurality of LC tanks comprises a binary weighted array of switchable capacitors.

23. The system according to claim 13, further comprising a second switching transistor coupled to said source of said single switching transistor.

24. The system according to claim 13, further comprising a third switching transistor coupled to said drain of said single switching transistor.

25. A method for operating an amplifier circuit comprising causing, during operation of said amplifier circuit, a resistance of at least a portion of said amplifier circuit to decrease by about one half, thereby increasing a Q factor of said amplifier circuit by about two, utilizing a single switching transistor.

26. An amplifier circuit, comprising circuitry that causes, during operation of said amplifier circuit, a resistance of at least a portion of said amplifier circuit to decrease by about one half, thereby increasing a Q factor of said amplifier circuit by about two, utilizing a single switching transistor.

* * * * *